United States Patent
Kanai et al.

(10) Patent No.: US 10,420,267 B2
(45) Date of Patent: Sep. 17, 2019

(54) ELECTRONIC COMPONENT MOUNTING APPARATUS

(71) Applicant: YAMAHA HATSUDOKI KABUSHIKI KAISHA, Shizuoka-ken (JP)

(72) Inventors: Osamu Kanai, Gunma (JP); Kunimune Komaike, Shizuoka (JP); Hideyuki Kamasuka, Gunma (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 280 days.

(21) Appl. No.: 15/305,122

(22) PCT Filed: Apr. 8, 2015

(86) PCT No.: PCT/JP2015/061017
§ 371 (c)(1),
(2) Date: Oct. 19, 2016

(87) PCT Pub. No.: WO2015/166776
PCT Pub. Date: Nov. 5, 2015

(65) Prior Publication Data
US 2017/0049013 A1    Feb. 16, 2017

(30) Foreign Application Priority Data
Apr. 30, 2014    (JP) ................... 2014-093679

(51) Int. Cl.
*H05K 13/04*    (2006.01)
*H05K 13/02*    (2006.01)
*H05K 13/08*    (2006.01)

(52) U.S. Cl.
CPC ......... *H05K 13/0413* (2013.01); *H05K 13/02* (2013.01); *H05K 13/0215* (2018.08);
(Continued)

(58) Field of Classification Search
CPC ............... H05K 13/04; H05K 13/0404; H05K 13/0408; H05K 13/0409; H05K 13/041;
(Continued)

(56) References Cited

U.S. PATENT DOCUMENTS

| | | |
|---|---|---|
| 5,541,834 A | 7/1996 | Tomigashi et al. |
| 6,359,646 B1 | 3/2002 | Kanauchi |
| 2002/0056188 A1 | 5/2002 | Yamaguchi |
| 2003/0072644 A1 | 4/2003 | Yamamura et al. |

(Continued)

FOREIGN PATENT DOCUMENTS

| | | |
|---|---|---|
| EP | 2 528 425 A2 | 11/2012 |
| JP | H06-045791 A | 2/1994 |

(Continued)

OTHER PUBLICATIONS

International Search Report issued in PCT/JP2015/061017; dated Jul. 14, 2015.

(Continued)

*Primary Examiner* — Peter Dungba Vo
*Assistant Examiner* — Joshua D Anderson
(74) *Attorney, Agent, or Firm* — Studebaker & Brackett PC (57) ABSTRACT

An electronic component mounting apparatus includes: a mounting head including a holder for extracting an electronic component and mounting the electronic component onto a substrate, the mounting head being movable in a horizontal direction; an imaging camera disposed on the mounting head for imaging a component extraction position, when the holder is at the component extraction position; a recognition unit for recognizing, based on an image captured by the imaging camera, a positional deviation between the component extraction position and a position of a housing portion where a component is stored in a component feeding unit or a position of the component in the housing portion; and a controller for correcting the component extraction (Continued)

position to a position shifted by a positional deviation recognized by the recognition unit before the component feeding unit extracts a subsequent component, and causing the mounting head to move to the corrected position.

5 Claims, 9 Drawing Sheets

(52) U.S. Cl.
CPC ..... *H05K 13/0408* (2013.01); *H05K 13/0417* (2013.01); *H05K 13/08* (2013.01); *H05K 13/0812* (2018.08); *Y10T 29/53174* (2015.01); *Y10T 29/53191* (2015.01)

(58) Field of Classification Search
CPC ........... H05K 13/0413; H05K 13/0417; H05K 13/0419; H05K 13/08; H05K 13/081; H05K 13/0812; H05K 13/0818; H05K 13/0882; Y10T 29/4913; Y10T 29/49131; Y10T 29/53091; Y10T 29/53174; Y10T 29/53178; Y10T 29/53183; Y10T 29/53191
See application file for complete search history.

(56) References Cited

U.S. PATENT DOCUMENTS

| 2005/0250223 | A1  | 11/2005 | Kano et al. |
| 2007/0011869 | A1* | 1/2007  | Watanabe .......... H05K 13/0215 29/739 |
| 2007/0130755 | A1  | 6/2007  | Duquette et al. |
| 2008/0201940 | A1* | 8/2008  | Watanabe .......... H05K 13/0417 29/740 |
| 2009/0119912 | A1  | 5/2009  | Watanabe et al. |
| 2013/0008019 | A1* | 1/2013  | Abe ................... H05K 13/0417 29/720 |

FOREIGN PATENT DOCUMENTS

| JP | 2002-050896 A | 2/2002 |
| JP | 2005-340799 A | 12/2005 |
| JP | 2007-012888 A | 1/2007 |
| JP | 2007-027213 A | 2/2007 |

OTHER PUBLICATIONS

The extended European search report issued by the European Patent Office dated Feb. 27, 2017, which corresponds to European Patent Application No. 15785940.6-1803 and is related to U.S. Appl. No. 15/305,122.

\* cited by examiner

ELECTRONIC COMPONENT MOUNTING APPARATUS

CROSS REFERENCE TO RELATED APPLICATION

This application claims benefit of priority to Japanese Patent Application 2014-093679 filed Apr. 30, 2014, and to International Patent Application No. PCT/JP2015/061017 filed Apr. 8, 2015, the entire content of which is incorporated herein by reference.

TECHNICAL FIELD

The present disclosure relates to an electronic component mounting apparatus for extracting an electronic component and mounting it onto a substrate by using a holder disposed on a mounting head.

BACKGROUND ART

For example, Japanese Unexamined Patent Publication No. 2007-12888 discloses a technique of moving a recognition camera to a sucking position before an electronic component is sucked and imaging a housing portion of a housing tape to thereby correct the component sucking position at which the component is to be sucked by a suction nozzle (holder).

However, the camera used in the above-mentioned conventional technique images a recognition mark on a substrate and, therefore, recognizes the component extraction position (sucking position) from directly above. Therefore, the camera images the component extraction position to allow recognition of the extraction position and the mounting head moves some distance in a horizontal direction, and thereafter the suction nozzle is lowered to suck the electronic component at the recognized extraction position. Thus, it takes some time to move the mounting head to the position at which the suction nozzle sucks the component, after the camera performs the imaging. Under such condition, if the number of times to image the component extraction position is increased relative to the number of component suction times, the productivity decreases. Accordingly, it has been difficult to increase the number of imaging times.

SUMMARY

The present disclosure aims to make it possible to reliably extract electronic components without reducing the productivity of a component mounting operation as much as possible.

An electronic component mounting apparatus according to an aspect of the present disclosure mounts an electronic component supplied by a component feeding unit onto a substrate, comprising: a mounting head including a holder for extracting an electronic component from the component feeding unit and mounting the electronic component onto a substrate, the mounting head being movable in a horizontal direction; an imaging camera disposed on the mounting head for imaging a component extraction position where a component is to be extracted from the component feeding unit, when the holder is at the component extraction position; a recognition unit for recognizing, based on an image captured by the imaging camera, a positional deviation between the component extraction position and a position of a housing portion where a component is stored in the component feeding unit or a position of the component in the housing portion; and a controller for correcting the component extraction position to a position shifted by a positional deviation recognized by the recognition unit based on an image captured by the imaging camera before the component feeding unit extracts a subsequent component, and causing the mounting head to move to the corrected position.

The objects, features and advantages of the present disclosure will become more apparent upon reading the following detailed description along with the accompanying drawings.

DETAILED DESCRIPTION OF EMBODIMENTS

Figure 1:
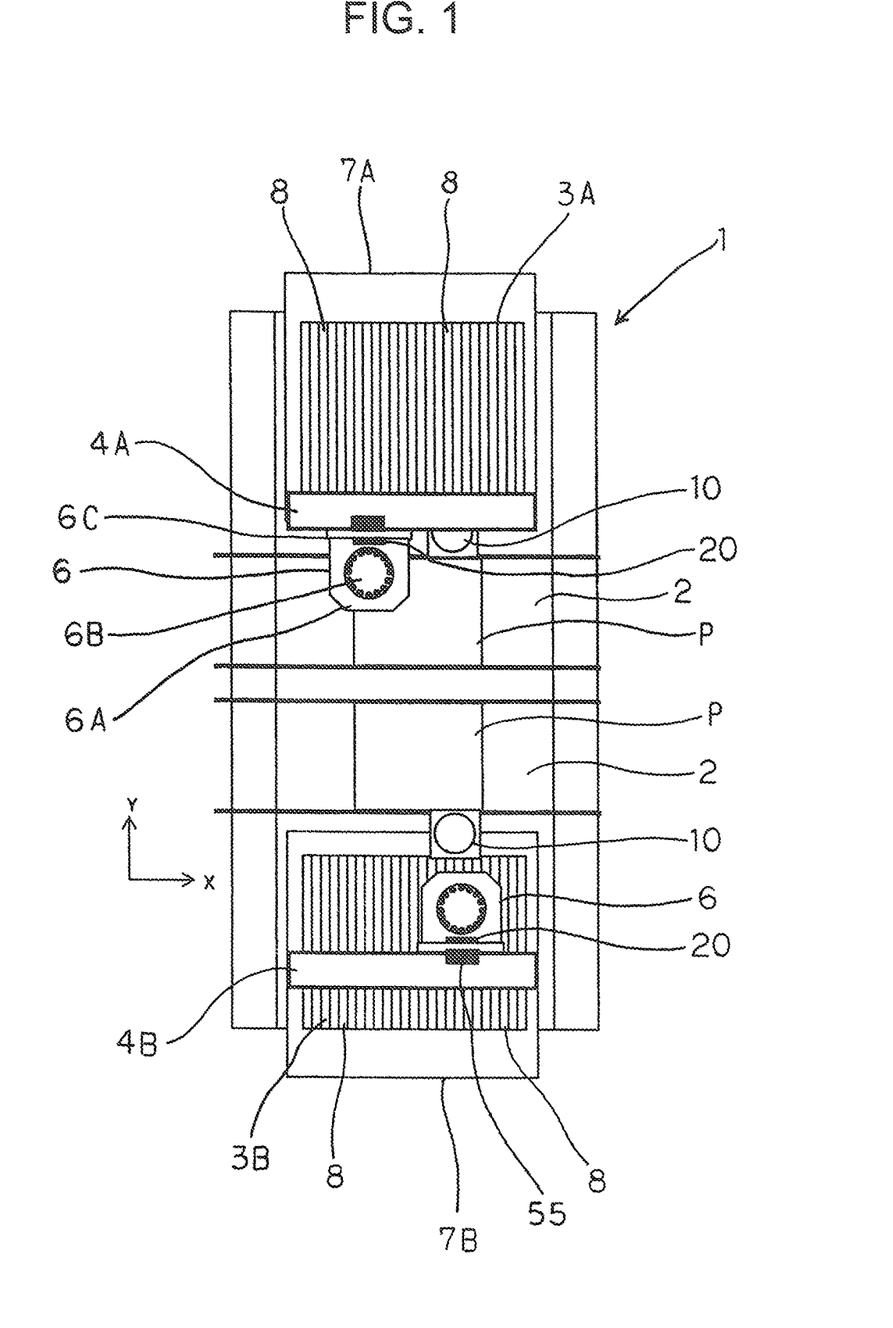
FIG. 1 is a top plan view of an electronic component mounting apparatus according to an embodiment of the present disclosure.

First, with reference to FIG. 1, an electronic component mounting apparatus 1, which mounts an electronic component D onto a printed substrate P as a substrate, according to an embodiment of the present disclosure will be described. The electronic component mounting apparatus 1 includes conveyor devices 2 for respectively conveying printed substrates P, component feeder devices 3A and 3B respectively disposed at a front side and a rear side of an apparatus body of the electronic component mounting apparatus 1 for feeding electronic components D, a pair of beams 4A and 4B that are movable by driving sources in one direction (reciprocally movable in the Y direction), and a pair of mounting heads 6 that are individually movable by respective driving sources in a direction along the beams 4A and 4B (in the X direction perpendicularly intersecting the Y direction). The mounting heads 6 will be described later with reference to FIG. 2.

The conveyor device 2 positions and secures a printed substrate P onto a positioning portion that is placed at substantially the center of the apparatus body by using an unillustrated positioning device.

The component feeder devices 3A and 3B are respectively disposed in front of and behind the conveyor devices 2, and each include a plurality of component feeding units 8 arranged side by side on a feeder base of a cart stand 7A (7B) serving as a mounting stand. The component feeding unit 8 supplies an electronic component D that is to be mounted onto a printed substrate P. Each of the cart stands 7A and 7B is detachably mounted on the apparatus body via a connecting tool in such a manner that distal ends of the component feeding units 8 on a component feeding side face a conveyance passage of a printed substrate P. When the cart stands 7A and 7B are properly mounted on the apparatus body, the power is supplied to the component feeding units 8 mounted on the cart stands 7A and 7B. Further, the cart stand 7A (7B) can be moved on castors disposed on its bottom surface by releasing the connecting tool and pulling an unillustrated handle.

The beams 4A and 4B are in the form of a pair of front and rear members having a longer dimension in the X direction. Unillustrated sliders secured to the beams 4A and 4B are driven to slide, by Y-direction movement driving sources 15 (FIG. 4) in the form of linear motors, along a pair of unillustrated left and right guides extending in a front-rear direction, whereby the beams 4A and 4B move individually in the Y direction.

Further, the beams 4A and 4B are respectively mounted with the mounting heads 6 that are movable in the horizontal direction. The mounting heads 6 are respectively disposed on inner sides of the beams 4A and 4B in such a manner as to be driven, by X-direction movement driving sources 16 (FIG. 4) in the form of linear motors, to move along guides extending in a longitudinal direction of the beams 4A and 4B (in the X direction). The X-direction movement driving source 16 includes a pair of unillustrated front and rear stators secured to the beam 4A (4B), and an unillustrated rotor disposed between the stators and on the mounting head 6.

The pair of mounting heads 6 are respectively disposed on the inner sides of the beams 4A and 4B and face each other. The rear mounting head 6 can extract an electronic component from the component feeding unit 8 of the corresponding rear component feeder device 3A and mount it onto a printed substrate P placed on the conveyor device 2. The front mounting head 6 can extract an electronic component from the component feeding unit 8 of the corresponding front component feeder device 3B and mount it onto the printed substrate P.

Figure 2:
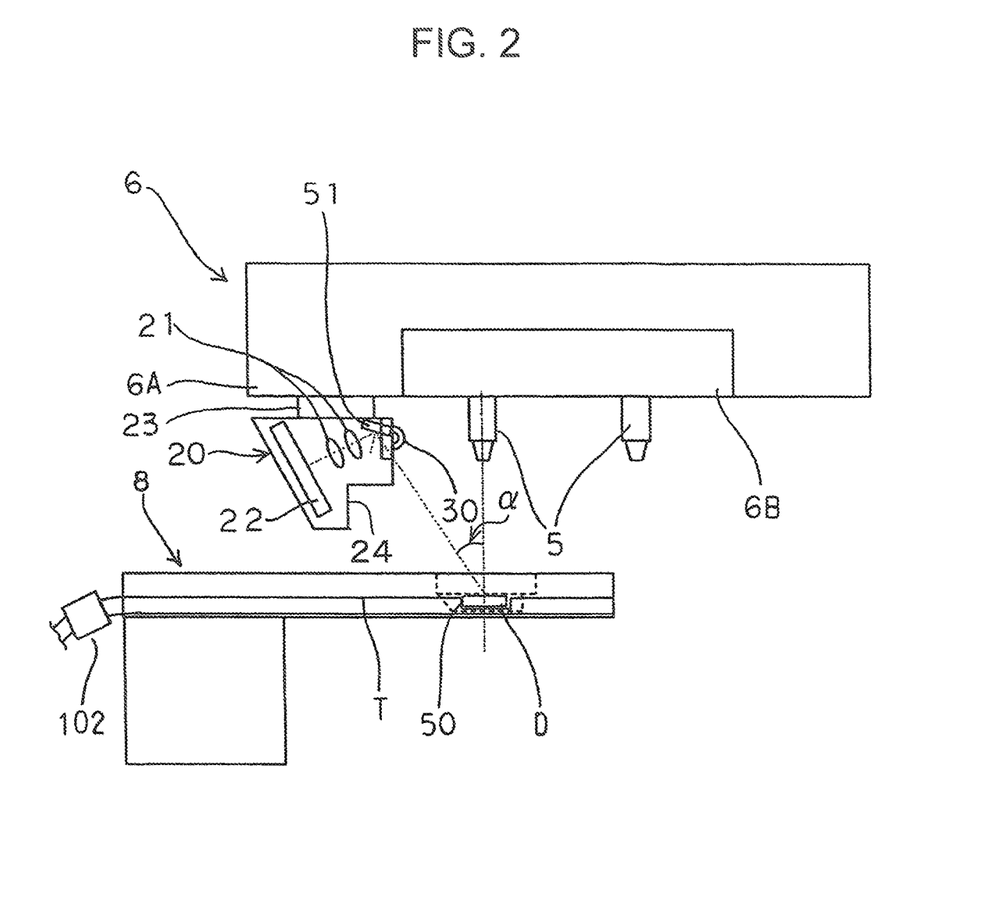
FIG. 2 is a side view of a mounting head in the electronic component mounting apparatus.
Figure 3:
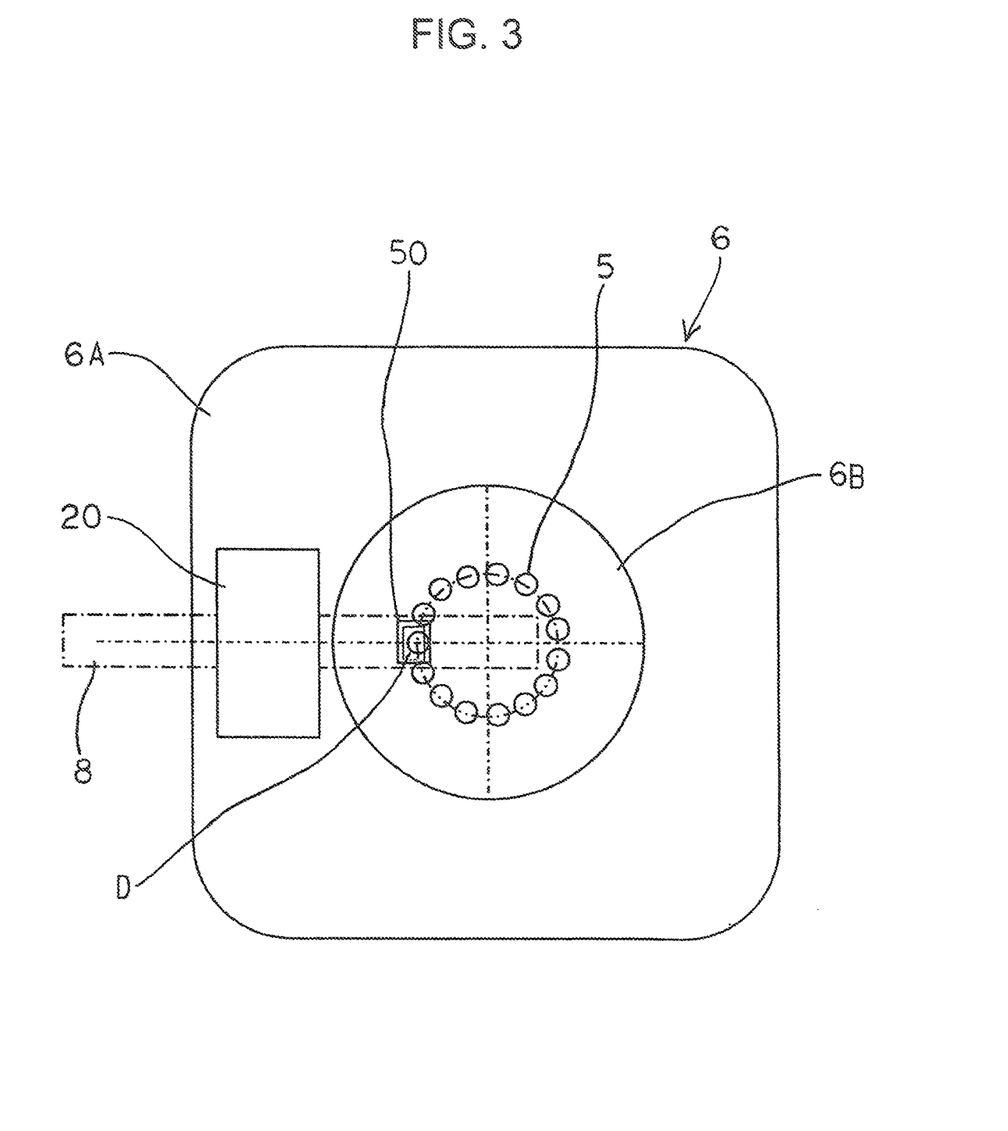
FIG. 3 is a top plan view of the mounting head.

Each mounting head 6 includes a stationary head mounting body 6A, a rotary body 6B in the form of a cylinder having a circular shape in a top plan view, and a mounting member 6C via which the head mounting body 6A and the rotary body 6B are movably mounted to the beam 4A (4B). The rotary body 6B is rotatable about a vertical axis by a θ-axis driving source 17. On a peripheral portion of the rotary body 6B, a plurality of suction nozzles 5 serving as holders of components are disposed at predetermined intervals in a circle about the center of the rotation. The suction nozzle 5 is vertically movable by a vertical axis driving source 18 and can perform an operation of extracting an electronic component D from the component feeding unit 8 by vacuum suction and an operation of mounting the extracted electronic component D onto a printed substrate P by stopping the vacuum suction. The rotary body 6B rotates with respect to the mounting head 6 and the stationary head mounting body 6A.

The component feeding unit 8 advances a housing tape T at predetermined intervals by driving of an unillustrated sprocket to position and stop each housing portion 50 storing an electronic component D at a predetermined component supply position (component extraction position), the housing tape T being advanced little by little from a state wound around an unillustrated feeding reel that is rotatably placed on the cart stand 7A (7B) (see FIG. 2). In order to execute this operation, the component feeding unit 8 includes a tape feeding mechanism for intermittently advancing the housing tape T to the extraction position of the electronic component D, and a cover tape peeling mechanism for peeling a cover tape from the housing tape T. The feed sprocket is rotated at predetermined angles by a feed motor to thereby allow the tape feeding mechanism to intermittently advance the housing tape T, the sprocket including teeth engageable with feed holes formed at predetermined intervals in the housing tape T. The housing tape T includes a carrier tape disposed at a lower portion thereof and including the housing portions 50, and a cover tape covering the top of the carrier tape. The cover tape peeling mechanism peels the cover tape from the carrier tape before the supply position by driving of a peeling motor. The housing portions 50 of the carrier tape are in the form of recesses formed at predetermined intervals (at the above-mentioned predetermined intervals) in a feed direction of the housing tape T, the recesses being also called as pockets. The component feeding unit 8 successively feeds the electronic components D placed in the housing portions 50 to the component supply position while peeling the cover tape by the tape peeling mechanism.

A respective component recognition camera 10 images electronic components D at once from below before mounting of them onto a printed substrate P, the electronic components D being held by suction on the suction nozzles 5 disposed on the rotary body 6B. The imaging is performed by illuminating the electronic components D held by suction on the suction nozzles 5 with light emitted from an unillustrated lighting unit provided near the recognition camera 10 and capturing its reflected image by the recognition camera 10. In the capturing of the reflected image, an image of portions of the electronic components D that reflect the light, such as leads, are captured. Therefore, an erroneous recognition may occur if there is a portion that is likely to reflect the light in the background. Accordingly, conditions are so set that the background is imaged dark in the imaging. For example, lower end surfaces of the suction nozzles 5 shown in FIG. 2 and a lower portion (including a lower surface of the rotary body 6B) of the mounting head 6 that is imaged in the background are painted black.

Hereinafter, the mounting head 6 will be described in detail with reference to FIGS. 2 and 3. As mentioned above, the mounting head 6 is movable in the X and Y directions (horizontal directions) by the X-direction movement driving source 16 and the Y-direction movement driving source 15. The rotary body 6B is rotatably supported by the head mounting body 6A. The rotary body 6B is rotationally driven by the θ-axis driving source 17 in the form of a servomotor.

The electronic component mounting apparatus 1 includes imaging cameras 20 each for imaging the component extraction position. The imaging camera 20 includes a telecentric lens 21 which does not change the magnification of an image of an object to be captured, and an imaging device 22 serving as a photoelectric conversion device, the imaging camera 20 being secured to the head mounting body 6A via a mounting body 23.

Each mounting head 6 is movable with respect to the beam 4A (4B) without changing the level. The suction nozzles 5 are arranged at the same distance from the rotational center of the rotary body 6B. Each suction nozzle 5 lowers to extract a component when it is at a predetermined rotational position (at the position of 9 o'clock shown in FIG. 3 which is closest to the beam 4A (4B): hereinafter referred to as "extraction rotational position") as a result of rotation of the rotary body 6B. The suction nozzle 5 resting at the extraction rotational position lowers from the mounting head 6 and extracts an electronic component D by vacuum suction, the electronic component D having been positioned at the position (component supply position) that is located directly thereunder and at which the electronic component D is supplied by the component feeding unit 8. Here, the component extraction position means a horizontal position of the electronic component D that is placed at the component supply position of the component supply unit 8 lying directly under the extraction rotational position.

In the present embodiment, the component feeding unit 8 is described as being configured to store electronic components D in a tape T. An alternative component feeding device may be adopted in which electronic components are arranged at predetermined intervals in the X and Y directions on a flat tray.

The imaging camera 20 is attached to the mounting head 6 in such a manner as to be able to image the component extraction position. When the suction nozzle 5 resting at the extraction rotational position is directly above the supply position of electric components D of the component feeding unit 8 (when the holder is at the component extraction position), the imaging camera 20 images an electronic component D resting at the component extraction position obliquely from above.

The level of the top surface of an electronic component D that is placed at the component extraction position is set based on a predetermined reference level. When the level of the top surface changes due to the thickness of the component or the like, the reference position of the component extraction position is changed. When, at the time of mounting of the electric component onto a printed substrate P, the imaging camera 20 images the mounting position to allow recognition processing and the level of the top surface of the printed substrate P differs from the above-mentioned reference level of the top surface of the electronic component D, a reference planar position of the mounting position of the component is also changed. It should be noted that in the component feeding unit 8, the level of the surface of the electronic component D and the level of the surface of the tape T can be considered as substantially equivalent when imaged by the imaging camera 20.

The imaging device 22 of the imaging camera 20 receives reflected light from an electronic component D that rests at the component extraction position and a housing portion 50 that stores the electronic component D. The reflected light is reflected by a mirror 51 and guided to the imaging device 22 via the telecentric lens 21, so that a light receiving surface of the imaging device 22 is exposed to the light. The exposure allows the imaging device 22 to obtain an image of the electronic component D and the housing portion 50 storing the electronic component D. A CMOS sensor or a CCD sensor can be adopted as the imaging device 22.

An LED 30 (lighting unit) for illumination is attached to a side surface of the imaging camera 20 that receives light to be imaged. When the imaging camera 20 performs imaging, the LED 30 is turned on to illuminate the component extraction position to allow the imaging camera 20 to receive reflected light from the electronic component D. Sufficient brightness to obtain a sufficiently recognizable image can be ensured if the distance from the LED 30 to the component extraction position or to the component resting at the component supply position of the component feeding unit 8 is set in the range of about 10 mm to 20 mm. The LED 30 has a front surface (image receiving surface on the right side of the imaging camera 20 shown in FIG. 2) that is covered with a transparent cover. This covered portion cannot be made to project toward the suction nozzles 5 much because it becomes bright if illuminated with illumination light of the component recognition camera 10. Therefore, the distal end of the projecting covered portion lies to the left of the rotary body 6B that is imaged in the background when the component recognition camera 10 images an electronic component D.

The LED 30 may be disposed at any position on a lower surface of the mounting head 6, but is preferred to be disposed at a position not too close to the suction nozzles 5 in order to make the background of the suction nozzles 5 dark.

The imaging camera 20 is preferred to be so disposed as to allow an axis (light axis) perpendicular to the receiving surface of the imaging device 22 and passing the center of the telecentric lens 21 to pass the extraction rotational position in a plan view as shown in FIG. 3. Further, the imaging camera 20 is preferred to be disposed at a position at which the axis coincides with the feed direction of the housing tape T of the component feeding unit 8. At this position, the suction nozzle 5 resting at the extraction rotational position can be located closer to the imaging camera 20 than the other suction nozzles 5 not resting at the extraction rotational position. This means that the angle α (see FIG. 2) between the above-mentioned axis and a vertical axis of the suction nozzle 5 can be minimized. Therefore, the above-described disposition of the imaging camera 20 allows, in the case that an electronic component D is imaged obliquely from above, the imaging camera 20 to image the electronic component D from a position most nearly above the electronic component D. Further, the center of a screen can be placed at the component extraction position, which allows an accurate recognition of an image.

However, the position of a housing portion 50 can be recognized as long as the center of the housing portion 50 resting at the component extraction position (the component supply position of the component feeding unit 8) is within the imaging screen even if it is not necessarily at the center of the screen. It is preferred that the whole image of the housing portion 50 is shown in the screen.

An electronic component D has a certain sufficient size to be sucked by the suction nozzle 5. Therefore, it is necessary to set the angle α between the beam of light taken into the imaging camera 20 from the component extraction position and the vertical direction in consideration of the size of the electronic component D. Consequently, the imaging camera 20 images the electronic component D obliquely from above. The imaging camera 20 has a recessed portion 24 in a lower portion of the suction nozzle 5-side so as not to come into contact with an electronic component D when an especially large electronic component D is sucked.

In the case that the extraction rotational position of the suction nozzle 5 is not at the position of 9 o'clock shown in FIG. 3 but at another position (for example, at the position of 3 o'clock, 12 o'clock or 6 o'clock), the imaging camera 20 may be so attached to the head mounting body 6A as to lie at the closest position to the extraction rotational position. Alternatively, the imaging camera 20 may be disposed at another position on the head mounting body 6A even if it lies farther from the extraction rotational position in a manner able to image the component extraction position.

The electronic component mounting apparatus 1 includes substrate recognition cameras 55. The substrate recognition camera 55 is disposed on the side of the head mounting body 6A of the mounting head 6 that is adjacent to the beam 4, as shown in FIG. 1. The substrate recognition camera 55 images a position directly thereunder to image a mark for positioning a printed substrate P.

Further, as shown in FIG. 2, a joint detection sensor 102 for a housing tape T is attached to a rear end of the component feeding unit 8. The joint detection sensor 102 includes an unillustrated light emitting element and light receiving element. It is configured such that the light emitting element and the light receiving element are disposed with a predetermined gap therebetween to allow the housing tape T to pass through the gap.

Specifically, when a housing tape T having no joint passes the joint detection sensor 102 in the advancing operation of the housing tape T, each time a feed hole Cb (see FIG. 7) passes the position between the light emitting element and the light receiving element, the light receiving element receives light from the light emitting element via the feed hole Cb. This allows the joint detection sensor 102 to detect the absence of a joint. On the other hand, in the case of a housing tape T having a joint, light from the light emitting element is blocked by a connecting tape 108A covering feed holes Cb in the course of the advancing operation. In this case, the light is not received by the light receiving element. By detecting this non-reception of light, it is possible to detect the existence of the joint in the housing tape T (see FIGS. 7 and 8).

Figure 7:
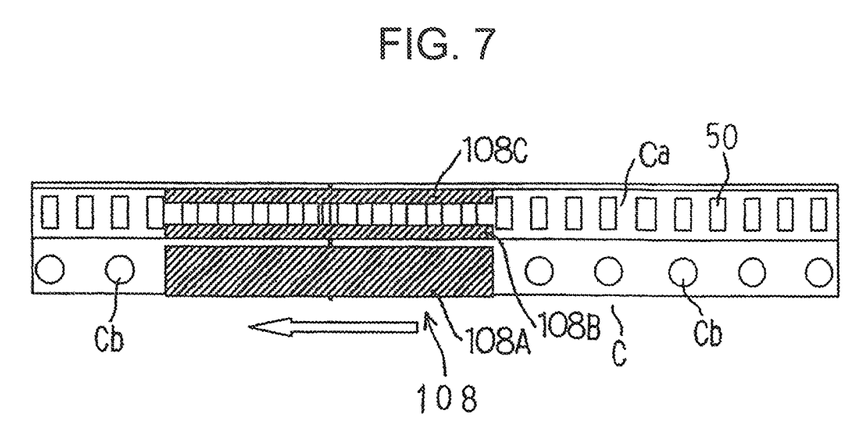
FIG. 7 is a top plan view of housing tapes connected by a connection tape.
Figure 8:
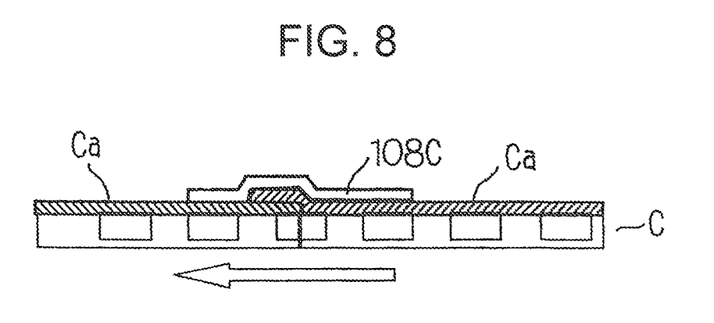
FIG. 8 is a side view of the housing tapes connected by the connecting tape.

The connecting tape 108A constitutes a connection tape 108 for connecting an old housing tape C from which electric components have been reduced and a new housing tape C, in cooperation with connecting tapes 108B and 108C each connecting respective one sides of housing portions 50 of the housing tapes T. The joint means a portion where the connection tape 108 is attached.

Figure 4:
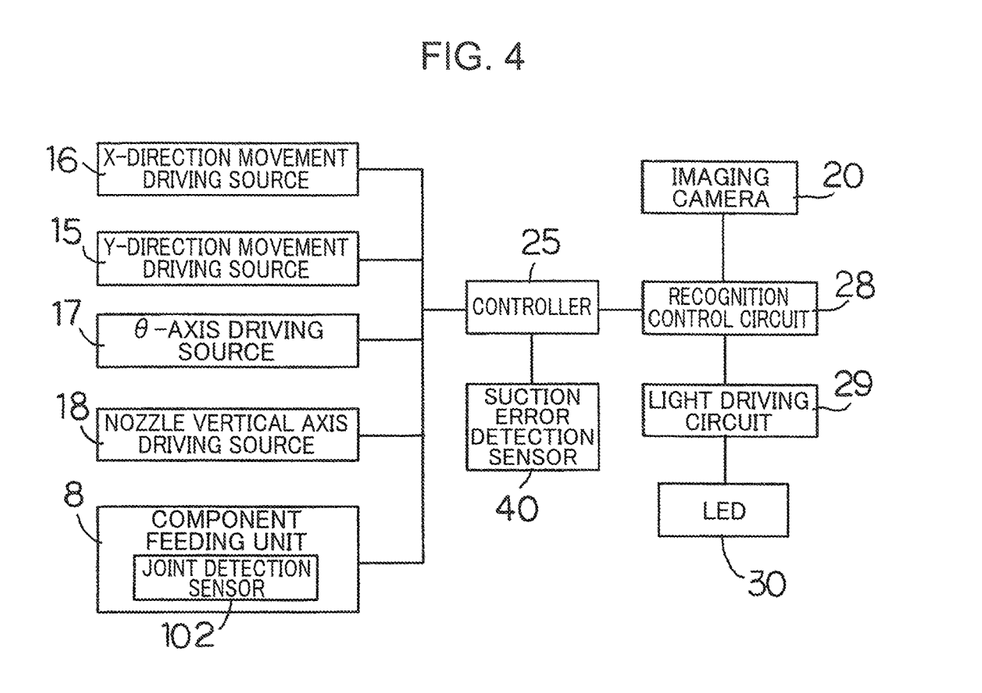
FIG. 4 is a control block diagram particularly relating to imaging and recognition processing of an electronic component performed in the electronic component mounting apparatus.

Now, with reference to a control block diagram of FIG. 4, a control configuration of the electronic component mounting apparatus 1 will be described. The electronic component mounting apparatus 1 includes a controller 25 (controller) that functions as a control device for integrally controlling operations related to mounting of an electronic component D, a determination device for making various determinations, a comparison device for making various comparisons, and the like. The controller 25 includes a storage section which stores mounting data having mounting coordinate information of the positions of electronic components D in the X and Y directions and their angular positions (positions in the θ direction) in a printed substrate P in the order of mounting step numbers (for each of the mounting order), mounting data having arrangement number information of the component feeding units 8 or the like, component arrangement positional data related to components ID of each component feeding unit 8 having the arrangement number, and component library data having size data, thickness data and the like of each electronic component D, for example. The electronic mounting apparatus 1 further includes a recognition control circuit 28 (recognition unit) and a light driving circuit 29.

The controller 25 controls the driving of the θ-axis driving sources 17 for causing the rotary bodies 6B to rotate, the X-direction movement driving sources 16 and the Y-direction movement driving sources 15 for the mounting heads 6, the nozzle vertical axis driving sources 18 for the suction nozzles 5, and the like. RT flags are set in the storage section of the controller 25 as described below.

Further, the storage section of the controller 25 stores, for each component feeding unit 8, a component extraction position at which an electronic component D should be extracted. The component extraction position is a position in the X and Y directions (planar directions) at which the suction nozzle 5 should be located for sucking an electronic component D. The controller 25 controls the mounting head 6 to stop at a position in the X and Y directions at which the sucking nozzle 5 resting at the extraction rotational position is located at the component extraction position for sucking a component.

The recognition control circuit 28 is connected to the controller 25 and performs processing of recognizing a positional deviation between the component extraction position and a position of a housing portion 50 of the component feeding unit 8 or a position of an electronic component D placed in the housing portion 50, based on an image captured by the imaging camera 20. Specifically, the recognition control circuit 28 receives image data that is obtained by imaging an electronic component D positioned at the component supply position (position at which the suction nozzle 5 extracts the component) and a housing portion 50 housing the electronic component D by the imaging camera 20, and performs recognition processing of the image data based on an instruction of the controller 25. The recognition control circuit 28 further controls the lighting driving circuit 29 to turn on the LED 30 for the imaging by the imaging camera 20.

The component feeding units 8 are connected to the controller 25 and communicate various types of data. A detection signal of the joint detection sensor 102 mounted on each component feeding unit 8 is also transmitted to the controller 25.

Suction error detection sensors 40 are connected to the controller 25, the suction error detection sensor 40 being operable to detect whether the suction nozzle 5 is sucking an electronic component D or whether the sucked electronic component D is in a normal posture, or the like. The detection sensor 40 includes, for example, a camera attached to a lower surface of the mounting head 6 for laterally imaging an electronic component D sucked on the lower end of the suction nozzle 5 that is at a raised position as shown in FIG. 2, or an optical sensor for laterally illuminating an electronic component D with beams of light on one side, and receiving the beams of light partially intercepted by the electronic component D on the other side. Each time an electronic component D is sucked, the detection sensor 40 immediately detects the presence/absence of the electronic component D and the presence/absence of a suction error.

Hereinafter, there will be described extraction operation of an electronic component D from a housing tape T and mounting operation of the electronic component D onto a printed substrate P. Upon pushing of an operation start switch portion of a touch panel switch of an unillustrated operation section by an operator, a printed substrate P is carried from an upstream side device into the positioning unit of the electronic component mounting apparatus 1, and a positioning mechanism starts a positioning operation.

Figure 9:
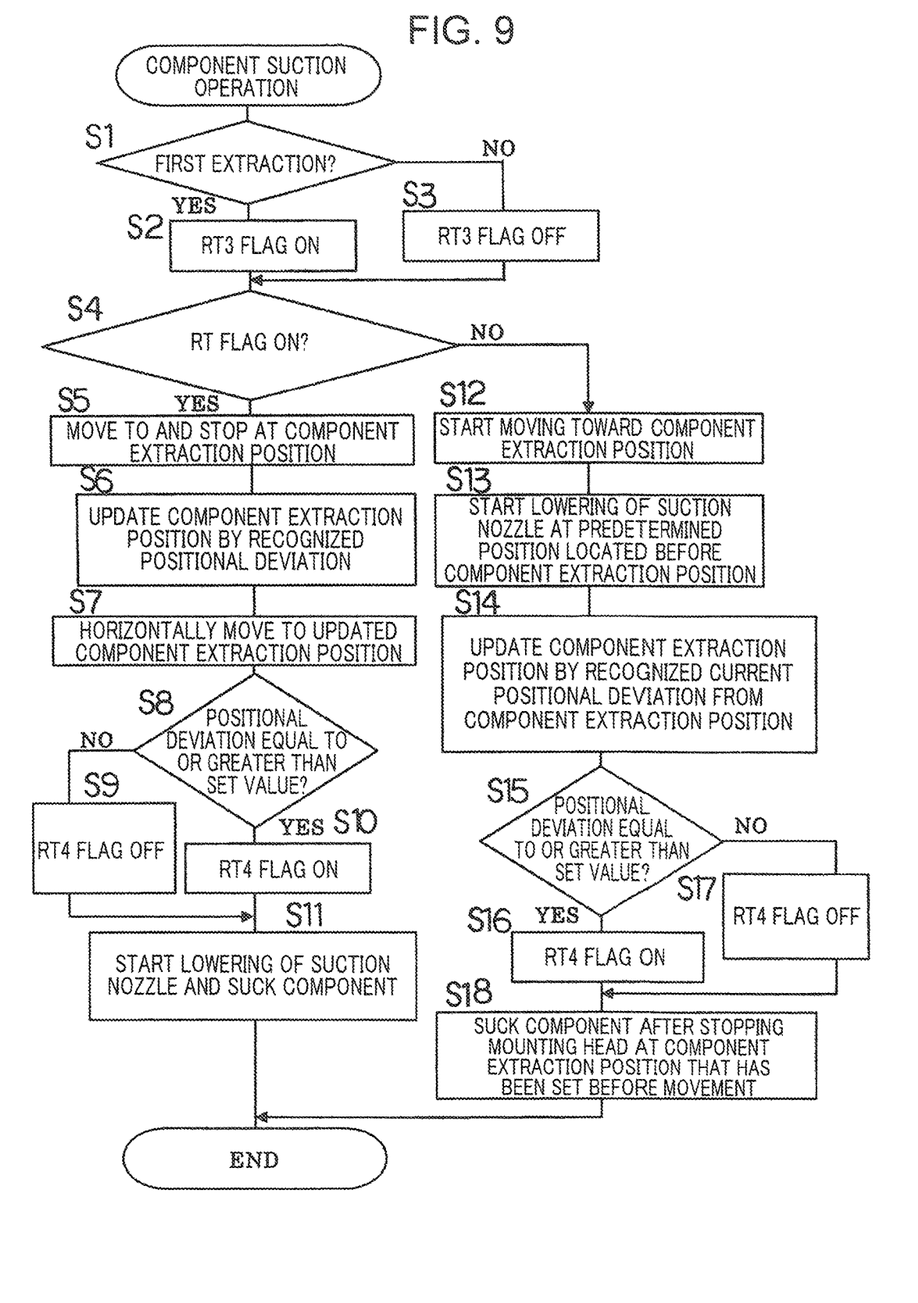
FIG. 9 is a flowchart of a component suction operation.

Thereafter, the controller 25 obtains mounting data that specify the XY coordinates and the rotational angle positions about the vertical axis at which electronic components D should be mounted in the printed substrate P, and the arrangement number indicating the arrangement position of the component feeding unit 8 from which the electronic components D should be extracted, and the like stored in the storage section. In accordance with the mounting data, the controller 25 performs such a control that the suction nozzles 5 of each mounting head 6 of the electronic component mounting apparatus 1 extract, by suction, electronic components D to be mounted, from the corresponding component feeding unit 8. In the sucking operation of electronic components D, the controller 25 controls various operations as shown in the flowchart of FIG. 9.

Specifically, the component feeding unit 8 that is to supply electronic components D performs an operation of advancing a housing tape T to feed the electronic components D to the component supply position in such a manner that each housing portion 50 storing an electronic component D is stopped and positioned at the component supply position. In parallel with this, the mounting head 6 moves in the X and Y directions in conjunction with movement of the beam 4. The mounting head 6 stops in a state that the suction nozzle 5 resting at the extraction rotational position has reached the position directly above the housing portion 50 resting at the component supply position of the component feeding unit 8 (i.e. the component extraction position).

In the above-described advancing operation, in the case that the electronic component D that is supplied by the component feeding unit 8 is the first electronic component D of the housing tape T that is supplied by the component feeding unit 8, it is determined as the first extraction (YES at step S1). Therefore, an RT3 flag provided in the storage section of the controller 25 is set on (step S2). The number of extraction times can be detected by a configuration in which a counter counts up each time an extraction operation is performed and resets when a housing tape is replaced.

In the case of the first extraction, because the RT3 flag is ON as mentioned above, the controller 25 determines that an RT flag as a whole is ON (YES at step S4). It should be noted that the RT flag is a flag for determination as a whole, and when one of an RT1 flag, an RT2 flag, and an RT4 flag described later and the RT3 flag provided in the storage section is set ON, the controller 25 determines that it is ON as a whole. On the other hand, when all of the RT1 to RT4 flags are set OFF, the controller 25 determines it is OFF as a whole.

When the first component extraction is performed, the imaging camera 20 has not imaged an electronic component D positioned at the component supply position of the component feeding unit 8 or its housing portion 50 of a replaced housing tape T. Therefore, the storage section stores an initially set design value as the component extraction position. Accordingly, movement of the mounting head 6 is controlled in such a manner that the suction nozzle 5 resting at the extraction rotational position stops at the component extraction position indicated by the initial value. Specifically, in order to cause the mounting head 6 to move to and stop at this position, the controller 25 first determines drive waveforms for driving the X-direction movement driving source 16 and the Y-direction movement driving source 15, and then gives instructions of the drive waveforms to the driving sources to thereby control the driving of motors included in the driving sources, or the like.

Figure 6:
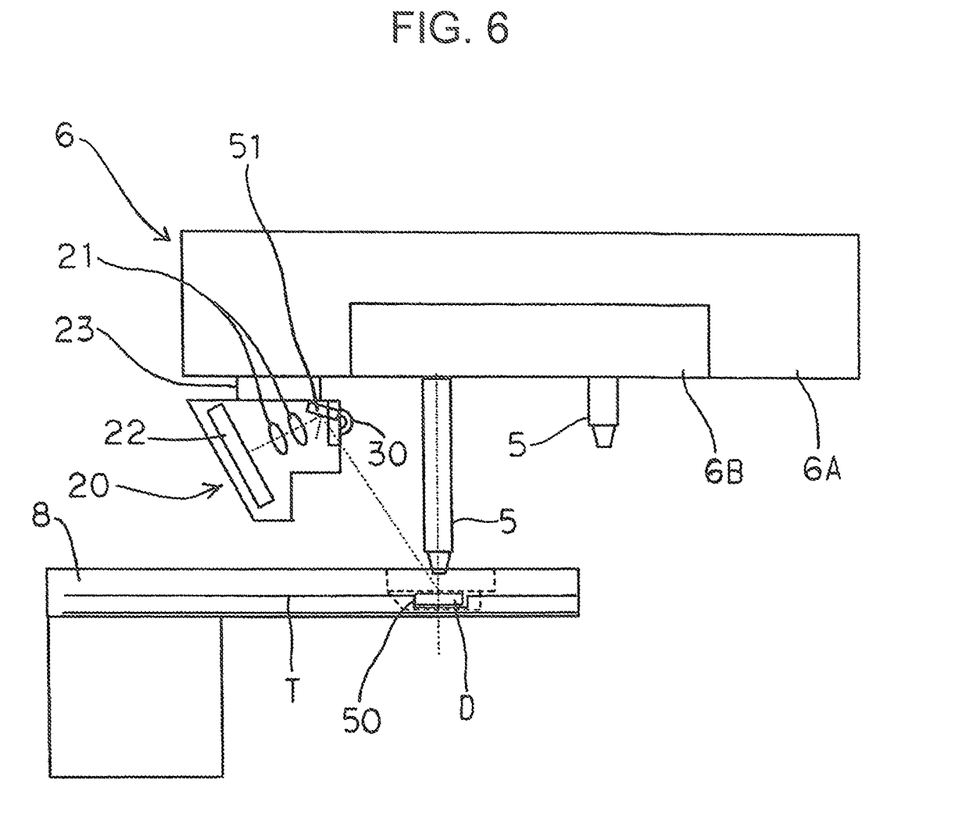
FIG. 6 is a side view of the mounting head illustrating imaging of an electronic component performed by the imaging camera.

First, the suction nozzle 5 moves to and stops at a position above this component extraction position (step S5). In the case of the first component extraction, the electronic component D is not always accurately positioned at the initially set position. Therefore, the suction nozzle 5 is not lowered at this stage and the imaging camera 20 images the housing portion 50 resting at the component supply position as shown in FIG. 6 (step S6).

Figure 5:
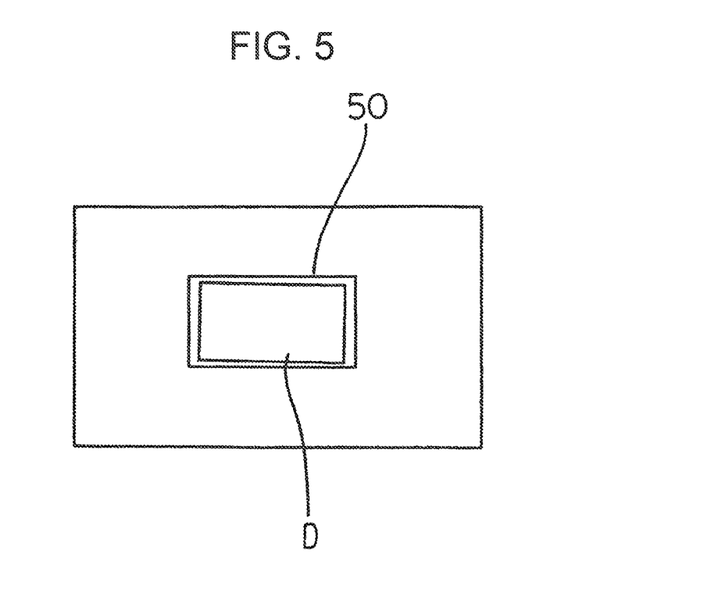
FIG. 5 is a diagram showing an image of a component extraction position captured by an imaging camera when a suction nozzle is above a component feeding unit.

At this time, the LED 30 turns on instantaneously to illuminate the component extraction position. The reflected light enters the imaging device 22 of the imaging camera 20 disposed obliquely above the housing portion 50. This allows the imaging device 22 to capture an image of the housing portion 50 and the electronic component D as shown in FIG. 5.

Image data of the captured image is transmitted to the recognition control circuit 28. A positional deviation between the component extraction position and the center of the image of the housing portion 50 is recognized based on the image. It should be noted that, in the present embodiment, the recognition control circuit 28 stores a condition specifying that the top surface of the electronic component D is at the reference level, and the component extraction position is at the center of the screen or, if not at the center, at any one of positions in the screen stored in the recognition control circuit 28. The center of the image of the housing portion 50 is an ideal position at which the center of the suction nozzle 5 is desired to be positioned for sucking. In order to correct the component extraction position so as to allow an ideal sucking of the electronic component D, it is necessary to move the mounting head 6 for correction in the X and Y directions by a recognized positional deviation.

Accordingly, the controller 25 updates the component extraction position before causing the suction nozzle 5 to lower (step S6), and causes the mounting head 6 (i.e. the suction nozzle 5) to move to the updated component extraction position (step S7). Thereafter, the suction nozzle 5 is lowered from the mounting head 6 to thereby allow the suction nozzle 5 to lower at the central position of the housing portion 50 to extract the electronic component D by sucking it at its substantially central position. The electronic component D may be shifted in the housing portion 50 in any direction due to its difference in size. However, the electronic component D can be suctioned at substantially its center as long as the suction nozzle 5 is positioned at the center of the housing portion 50, which allows extraction of the electronic component D in a stable position (step S11). Also when causing the suction nozzle 5 to lower, the controller 25 generates a drive waveform for driving the nozzle vertical axis driving source 18 to move the suction nozzle 5 to a predetermined level and stop it. An instruction of the waveform is given to the driving source 18 to control the driving of a motor or the like.

At this time, in the case that the recognized positional deviation is equal to or greater than a set predetermined allowable value (YES at step S8), the controller 25 sets the RT4 flag ON (step S10). Consequently, in the subsequent component extractions, it is possible to suck each electronic component D after correcting a positional deviation in real time, the positional deviation being calculated by the recognition control circuit 28 after the imaging camera 20 images the electronic component D. In the case that the recognized positional deviation is smaller than the set predetermined allowable value (NO at step S8), the controller 25 sets the RT4 flag OFF.

After all predetermined suction nozzles 5 extract electronic components D, the mounting head 6 is moved to a position above the printed substrate P. The electronic components D held by the corresponding suction nozzles 5 are mounted onto the respective positions of the printed substrate P indicated by the mounting data. FIG. 5 shows an example in which a rectangular electronic component D is placed. In this case, the hole of the housing portion 50 also has a rectangular shape in conformity with the outer shape of the electronic component D. Because the imaging camera 20 performs imaging by using the telecentric lens 21, the lateral dimension of an image is not corrected. On the other hand, the vertical dimension (in the feed direction of the housing tape T) of the image is shorter than the imaged object due to the oblique imaging and, therefore, the vertical dimension is corrected in the recognition processing as necessary.

In the case that an imaged electronic component D is determined to have a scratch or a missing portion as a result of recognition of the top surface condition thereof, the electronic component D is discarded without being mounted onto the printed substrate P after being sucked. Alternatively, the housing tape T may be advanced by one pitch to position the subsequent housing portion 50 at the component supply position, leaving such electronic component D unsucked. In the case that, as a result of recognition of an electronic component D, the electronic component D is determined to be different from an electronic component D specified by the mounting data based on a mark or a letter indicating the size or the type of the component, the controller 25 may display the abnormality on an unillustrated monitor and stop the mounting operation. At this time, a light having a rod-like shape such as a cylinder may be installed at the center of the group of the plurality of suction nozzles 5 arranged in the form of a ring (i.e. the center of the lower surface of the mounting head 6) to illuminate the component extraction position.

In the case that the above-mentioned component feeding unit 8 extracts the subsequent electronic component D, it is determined as the second component extraction (NO at step S1) and, therefore, the RT3 flag is set OFF (step S3) based on the counter value.

Thereafter, in the case that the RT1 flag, the RT2 flag, and the RT4 flag are OFF, the controller 25 determines that the RT flag as a whole is OFF (No at step S4). The controller 25 generates drive waveforms for lowering the suction nozzle 5 before the mounting head 6 stops at the component extraction position and gives the drive waveforms to the driving sources. The reason for this operation is that the positional deviation between the center of the housing portion 50 in which the component extraction position is accurately positioned at the component supply position, and the suction nozzle 5 is highly likely to be small.

Specifically, first, the mounting head 6 starts horizontally moving toward the component extraction position (step S12). The suction nozzle 5 resting at the extraction rotational position starts lowering before moving to the component extraction position (step S13). The imaging camera 20 performs imaging after the suction nozzle 5 is located at the component extraction position (that has been corrected after the imaging performed at the time of the first component extraction) stored in the storage section of the controller 25 and the mounting head 6 stops the horizontal movement. In other words, the controller 25 causes the imaging camera 20 to image the component extraction position at the stage when the suction nozzle 5 is lowering at the component extraction position. Based on image data obtained by this imaging, the controller 25 corrects a positional deviation of the housing portion 50 from the component extraction position that has been recognized by the recognition control circuit 28, and updates the current component extraction position to a new component extraction position. When the component extraction position is thus updated, the controller 25 stores it in the storage section. The position of the housing portion 50 usually means its center.

It should be noted that the controller 25 may store the component extraction position that has been corrected by a positional deviation obtained by the recognition performed at the time of the previous extraction of an electronic component D in the storage section, and control the mounting head 6 to move to the corrected position, but an offset due to other factors may be additionally considered. For example, the stop position of housing portions 50 may change depending on the rotational position of the sprocket that include feed teeth in a circumferential portion, the feed teeth being engageable with the feed holes Cb formed in the housing tape T of the component feeding unit 8 (owing to the feed teeth engageable with the feed holes Cb). In the case that an offset value is stored for each rotational angle or the like, the controller 25 may determine the component extraction position in additional consideration of the offset value.

During this time, the suction nozzle 5 lowers at the previous component extraction position to extract an electronic component D. In this manner, because the suction nozzle 5 starts lowering before the mounting head 6 stops moving, the time taken to suck the electronic component D is reduced. It should be noted, however, that even if there is a positional deviation, the controller 25 does not cause a correction movement because it is too short to move the mounting head 6 for correction before the suction nozzle 5 sucks the electronic component D. If it is determined that a correction can be made during the lowering time, the correction movement may be performed. Even if the mounting head 6 is not moved for correction, the positional deviation from the previous component extraction position is expected to be small. Therefore, the suction operation can usually be performed without any problem in a stable posture even if the electronic component D is sucked without any change.

In the case that a recognized positional deviation of the component extraction position with respect to the housing portion 50 is equal to or greater than a set value for some reason (YES at step S15), the controller 25 sets the RT4 flag ON (S16). When the RT4 flag is ON, and something happens, for example when the housing tape T is in a bad condition, it is possible to correct, in extraction of the subsequent electronic component D, a positional deviation of the electronic component D to be sucked before it is sucked.

Thereafter, when the positional deviation decreases to the set value or less and the sucking becomes stable (NO at step S15), the controller 25 sets the RT4 flag OFF. Consequently, on condition that the other RT1 to RT3 flags are OFF, the operation can proceed to step S12 and the subsequent steps shown in the flowchart of FIG. 9 to perform component extraction more quickly.

Figure 10:
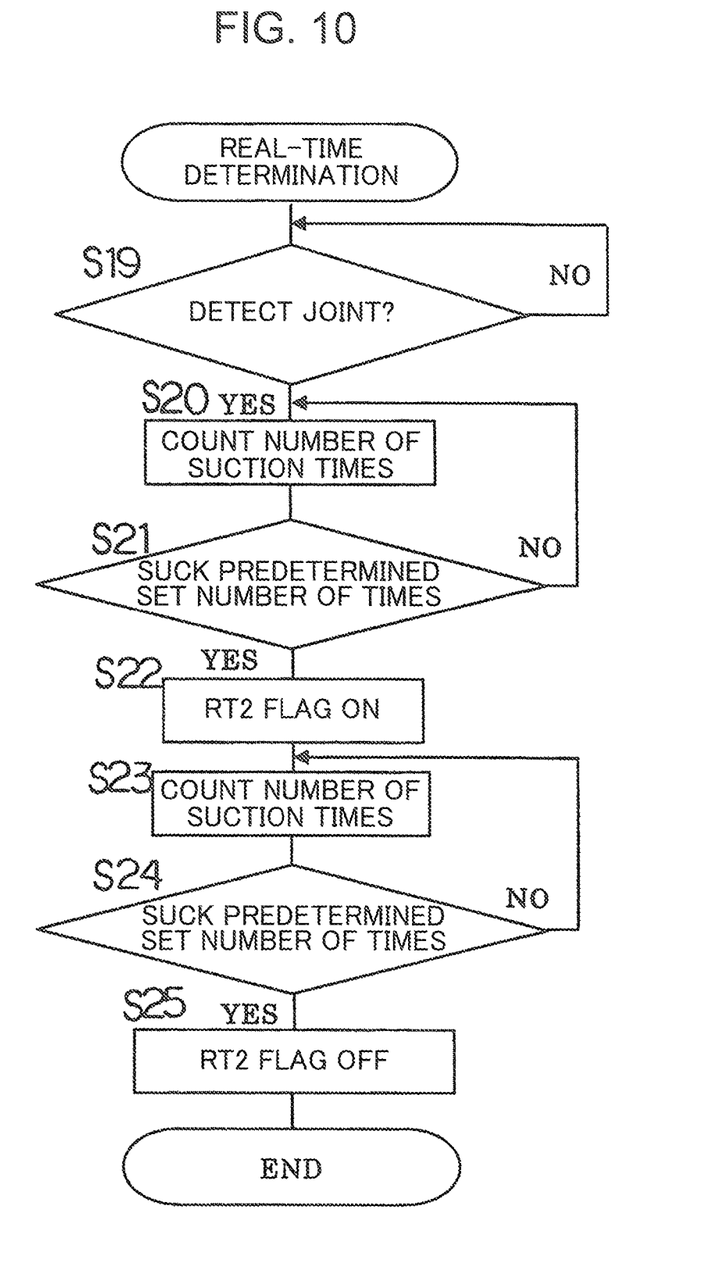
FIG. 10 is a flowchart showing setting of a flag after a joint detection.

Now, with reference to the flowchart of FIG. 10, there will be described determination processing of whether to perform a correction movement of an electronic component D for extraction, the electronic component D having been subjected to the recognition processing, based on a joint detection of housing tapes T (determination of whether to perform a real-time correction). In this case, the RT2 flag stored in the storage section of the controller 25 is set ON or OFF, and the operation is performed in accordance with the flowchart of FIG. 9, depending on the state of this flag.

Electronic components D placed in an old housing tape T are successively sucked by the suction nozzles 5 to run out from the old housing tape T. In such a case, a worker connects the leading end of a new housing tape T for feeding electronic components D of the same type to the terminal end of the old housing tape T by using the connection tape 108. Consequently, it is possible to prevent a production operation of the electronic component mounting apparatus 1 from stopping due to running out of components and, therefore, improve the efficiency of the operation of mounting electronic components onto a printed substrate P.

However, because the new housing tape T is manually connected to the old housing tape T by using the connection tape 108, the position of the housing portions 50 of the new housing tape T may deviate from the position of the housing portions 50 of the old tape T. In this case, a recognized positional deviation of the housing portion 50 with respect to the component extraction position will be great. Therefore, it is preferred not to lower the suction nozzle 5 at the component extraction position that is set based on the previous recognition processing, but to move the mounting head 6 by the positional deviation obtained in the recognition processing when an electronic component D subjected to the recognition processing, i.e. the electronic component D placed in the housing portion 50 subjected to the recognition processing, is extracted. Accordingly, in the case that the joint detection sensor 102 detects a joint tape 108, i.e. detects a joint (YES at step S19), the controller 25 counts up the number of suction times when the suction nozzle 5 sucks (extracts) an electronic component D from the housing tape T thereafter (step S20). When the counted number of times reaches a predetermined number of times (step S21), the controller 25 sets the RT2 flag ON (step S22).

In other words, when the subsequent electronic component D is extracted from the component feeding unit 8 for which the RT flag has been set ON, the control is performed in accordance with steps S5 to S7 shown in FIG. 9. The predetermined number of times serving as a threshold value at step S21 may be set to the number of times that will be counted, after a joint is detected, when an electronic component D is extracted from the housing portion 50 preceding the first housing portion 50 of the range covered by a connection tape 108, for example. This set number may be stored in the storage section of the controller 25.

Thereafter, electronic components D are extracted in accordance with the flowchart of FIG. 9. At this time, the number of suction times is counted each time an electronic component D is sucked (step S23), and when the count reaches a predetermined number of times (YES at step S24), the controller 25 sets the RT2 flag OFF. Consequently, the operation can be performed in accordance with steps S12 to S14 shown in FIG. 9 from the subsequent component extraction of the component feed unit 8 to perform the extraction operation more quickly. The predetermined number of times set at step S24 may be the number of times that is counted when a component is extracted from the final housing portion 50 of the range covered by the connection tape 108, for example.

When the housing portion 50 being at the joint is recognized, the controller 25 sets the RT2 flag ON. Consequently, it is possible to move the mounting head 6 for correction by a deviation obtained as a result of the recognition processing and lower the suction nozzle 5 to suck an electronic component D.

As described above, the position at which the RT2 flag is set ON is selected based on the counted number of suction times of electronic components D. It is preferred to set and store a threshold value for the count value (predetermined set number of times) in such a manner as to cause the RT2 flag to be set ON at least when an electronic component D is extracted from the first housing portion 50 of a connected new housing tape T. This is because in the case that the preceding and succeeding housing tapes T are connected at mutually shifted positions, the positional difference between these housing tapes T at their boundary (in a longitudinal direction of the housing tapes T or a direction perpendicularly intersecting the longitudinal direction) is great. Further, the portions that precede and succeed the boundary are also mutually shifted due to this positional difference. A portion including these preceding and succeeding portions where the positional difference may occur can be considered as a joint. This may cover a range over which a connection tape 108 is attached or a wider or narrower range.

Figure 11:
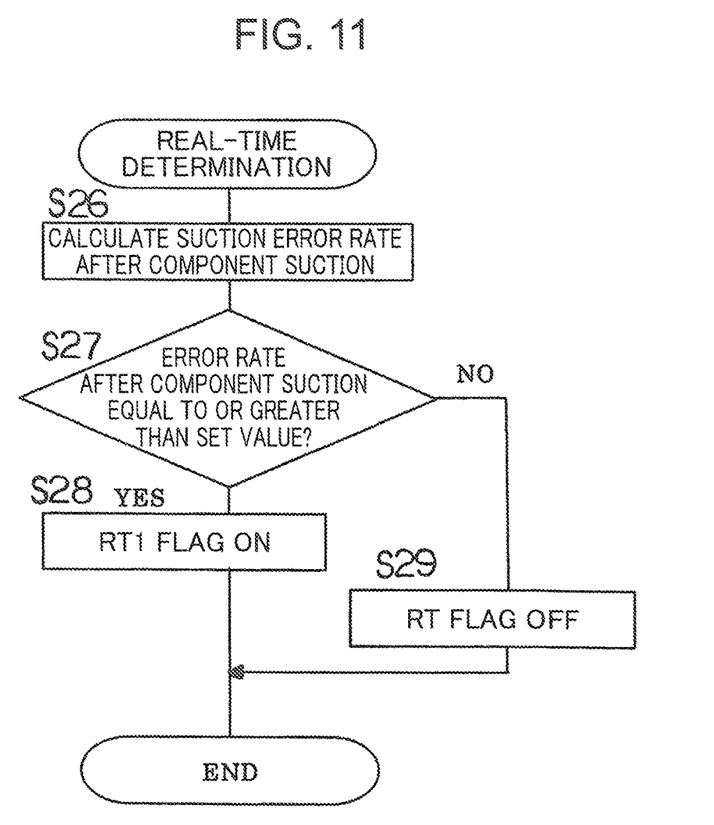
FIG. 11 is a flowchart showing setting of a flag depending on the suction rate.

Now, with reference to the flowchart of FIG. 11, there will be described determination processing of whether to perform a correction movement of an electronic component D for extraction, the electronic component D having been subjected to the recognition processing, based on the suction error rate of electronic components D.

When an electronic component D is extracted from a housing portion 50 of a housing tape T, a suction error may occur such as "absence" of the electronic component D or an abnormality in the sucked position of the electronic component D (oblique suction with respect to a lower surface of the suction nozzle 5 or suction of the component in a raised state). Such a suction error is likely to occur when the suction nozzle 5 sucks the electronic component D at a position away from a position at which the suction should be performed, such as the center of the electronic component D or the like. A suction error is detected by the suction error detection sensor 40, but may be recognized and determined based on the imaging screen of the component imaging camera 10.

The controller 25 counts up the number of times when a suction error is detected by the suction error detection sensor 40 or the component recognition camera 10 in extraction of an electronic component D by the suction nozzle 5. Thereafter, the controller 25 calculates, as the suction error rate, the ratio of the number of suction error times to the total number of suction times including the number of component suction times at which no suction error occurs (step S26). In the case that the calculated suction error rate is equal to or greater than a set threshold value (YES at step S27), the controller 25 sets the RT1 flag for the relevant component feeding unit 8 ON (step S28). It is preferred to calculate, as the total number of suction times, the number of component extraction times that have been performed until immediately before the current extraction. Consequently, when a component is extracted from the component feeding unit 8 after the RT1 flag is set ON, the control is performed in accordance with steps S5 to S7 shown in FIG. 9. In this manner, the suction error rate is updated for each component extraction, and when the suction error rate is smaller than the set value (NO at step S27), the controller 25 sets the RT1 flag OFF (step S29).

The controller 25 may be so configured as to turn the RT1 flag OFF when, after the RT1 flag is set ON due to the suction error rate greater than the set value, the calculated suction error rate becomes smaller than the determination threshold value used at step S27. In addition, in the case that it is determined that no electronic component D is placed in a housing portion 50 as a result of the recognition processing in which the imaging camera 20 images the housing portion 50, it is preferred not to include this component extraction having the suction error in the count of the number of component extraction times.

The present embodiment describes the four types of RT flags that are stored according to the situation, the RT flag being set ON when a predetermined condition is satisfied, to cause the controller 25 to correct a recognized deviation when an electronic component D having been subjected to the recognition processing by the recognition control circuit 28 is extracted. An RT5 flag may be added to these flags and the controller 25 is so configured as to set the RT5 flag ON or OFF when, in the case that a housing portion 50 is relatively great with respect to an electronic component D and the position of the electronic component D is not stable in the housing portion 50, a positional deviation of the electronic component D with respect to the suction nozzle 5 is great, the positional deviation being recognized based on imaging by the component recognition camera 10.

Further, in the present embodiment, as shown in the flowchart of FIG. 9, the position of an imaged housing portion 50 and the component extraction position are compared. In the case of imaging a housing portion 50, an electronic component D placed therein is also imaged. Therefore, a positional deviation between the position of the electronic component D in the image and the component extraction position may be calculated to perform a control in the same manner as shown in FIG. 9.

When all of electronic components D held on the suction nozzle 5 of the same mounting head 6 are determined as normal electronic components D and stably sucked, they are moved to a position above the component recognition camera 10 by a horizontal movement of the mounting head 6. The recognition camera 10 images all the electronic components D held on the plurality of suction nozzles 5 of the mounting head 6 at once to allow recognition of the horizontal position with respect to the mounting head 6. When there is a positional deviation from a proper position, the positional deviation is corrected before the electronic components D sucked on the suction nozzles 5 are successively mounted onto proper positions on a printed substrate P.

It can be configured such that, at this time, when an electronic component D that is sucked on the suction nozzle 5 resting at the extraction rotational position is mounted, the imaging camera 20 images the mounted electronic component D under lighting of the LED 30 and the controller 25 checks if the electronic component D is mounted at a proper position based on the relative position to a pattern position on the printed substrate P or the like. Alternatively, it can be configured such that the component extraction position lying under the suction nozzle 5 is imaged immediately before and immediately after the mounting and the controller 25 determines whether the suction nozzle 5 is raised without leaving the electronic component D unheld so that the electronic component D is reliably mounted, for example.

Figure 12:
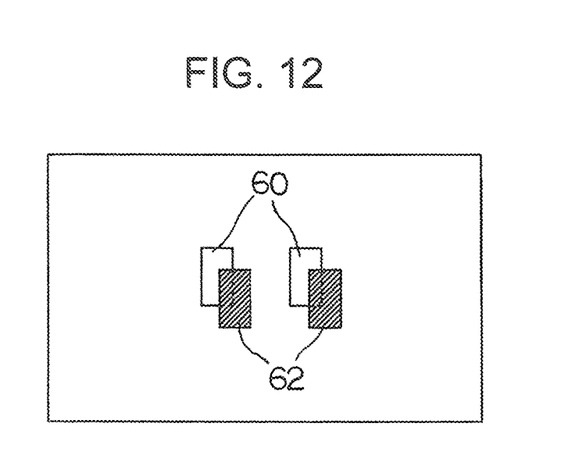
FIG. 12 is a diagram showing an image of a component mounting position on a printed substrate captured by the imaging camera.

Alternatively, it may be configured such that when the electronic component D that is sucked on the suction nozzle 5 resting at the extraction rotational position of the mounting head 6 is mounted onto a printed substrate P, the mounting head 6 is moved to and stopped at a position in the X and Y directions indicated by the mounting data at which the suction nozzle 5 should be located, and the imaging camera 20 images cream solder printed at that position to allow the recognition control circuit 28 to recognize the position. It can be configured such that when, as a result of the recognition of such an image as shown in FIG. 12, the position (such as the centroid position) of a printed pattern 60 of cream solder deviates from the mounting position indicated by the mounting data, the mounting head 6 is moved for correction by that amount in the X and Y directions and the suction nozzle 5 is lowered to mount the electronic component D onto the position of the cream solder. At this time, the correction movement of the mounting head 6 in the X and Y directions and the lowering of the suction nozzle 5 may be performed in parallel. Alternatively, the suction nozzle 5 may be lowered after the mounting head 6 is moved for correction. Alternatively, the mounting head 6 may be moved for correction when it is moved to a mounting position of the subsequent electronic component D. Further, it may be configured such that the mounting head 6 is moved for correction by the recognized deviation when it is moved to the subsequent mounting position, without performing a correction movement at the imaged mounting position.

Further, it is preferred that the component mounting of each suction nozzle 5 of the mounting head 6 is performed in such a manner that the suction nozzle 5 is always rotated to be positioned at the extraction rotational position before the imaging camera 20 performs imaging as described above, and a correction operation of the position of the mounting head 6 to the position of a printed pattern 60 is performed before mounting of a component. At this time, it is efficient if the suction nozzles 5 of the mounting head 6 mount the electronic components D in the order in which the rotary body 6B is rotated gradually in the same direction at attachment intervals of the suction nozzles 5 so that the adjacent suction nozzles 5 are successively positioned at the extraction rotational position to mount the respective component. In this manner, it is possible to improve the mounting accuracy in the component mounting while maintaining the productivity of the component mounting.

Further, it may be configured not only to recognize, at the time of mounting, the printed position of cream solder, but also to recognize the position of wiring patterns 62 to which electrodes of an electronic component D should be connected that are formed on a printed substrate P as shown in FIG. 12, and to correct a deviation, if any, in the same manner before the mounting. The pair of printing patterns 60 and the pair of wiring patterns 62 shown in FIG. 12 are formed at positions corresponding to two electrodes of electronic components D having a rectangular shape and the two electrodes, such as a resistor, condenser and the like, that are to be mounted at the same mounting position. Whether to perform a correction based on a positional deviation of cream solder or a deviation of wiring patterns may be changed according to the setting, or may be set depending on the type of a component. This is because in one case, an electronic component D is placed on cream solder and electrodes of the electronic component D are connected to wiring patterns owing to the effect of so-called self-alignment, and in another case, an electronic component D can be more reliably connected to wiring patterns by being positioned on the wiring patterns because of little self-alignment effect.

In addition, the mounting head 6 itself does not lower and raise, but only the suction nozzle 5 lowers and raises. Consequently, the imaging camera 20 can always image the component extraction position. However, in the case that the mounting head 6 lowers and raises, it only needs to control the illumination of the LED 30 and the exposure timing of the imaging device 22 to allow imaging of the component extraction position when the mounting head 6 is at a predetermined level.

The embodiment of the present disclosure has been described above, for which various alternate embodiments, modifications and changes can be made based on the above description. Therefore, the present disclosure includes those various alternate embodiments, modifications and changes without departing from the spirit of the disclosure.

According to the above-described disclosure, it is possible to provide an electronic component mounting apparatus capable of reliably performing extraction of electronic components without reducing the productivity of component mounting as much as possible.

The invention claimed is:

1. An electronic component mounting apparatus for mounting electronic components supplied by a component feeding unit onto a substrate, the electronic component mounting apparatus comprising:

a mounting head including a holder for extracting electronic components from housing portions of the component feeding unit positioned at a component extraction position;

an imaging camera disposed on the mounting head for imaging the component extraction position when the holder is at the component extraction position;

a recognition unit for recognizing a positional deviation between the component extraction position and a position of the housing portion of an electronic component or a position of the electronic component in the housing portion based on an image of the component extraction position captured by the imaging camera; and a controller configured to correct the component extraction position of a previous electronic component to a position shifted by the positional deviation recognized by the recognition unit from an image of the previous electronic component taken by the imaging camera before lowering of the holder and causing the mounting head to move to the corrected component extraction position before the previous electronic component is extracted by the holder and stores the corrected component extraction position;

and wherein in a case that the recognized positional deviation of the previous electronic component is smaller than a predetermined allowable value and after the mounting of the previous electronic component, the controller causes the imaging camera to image the component extraction position for correction of the positional deviation of a subsequent electronic component when the holder starts lowering at the component extraction position as opposed to imaging the component extraction position before lowering the holder.

2. The electronic component mounting apparatus according to claim 1, wherein:

the holder is mounted on the mounting head in a vertically movable manner; and the controller causes the imaging camera to image the component extraction position before the holder lowers with respect to the mounting head to extract the previous electronic component, and causes the holder to lower after the recognition unit performs the recognition processing of positional deviation of the previous electronic component.

3. The electronic component mounting apparatus according to claim 1, further comprising a determiner for determining to correct the recognized positional deviation when the component subjected to the recognition by the recognition unit is extracted, when a predetermined condition is satisfied, wherein the determiner sets a flag as ON to perform the correction of the positional deviation of the component extraction position of the subsequent electronic component in the case that the recognized positional deviation of the component extraction position of the previous electronic component with respect to the housing portion is equal to or greater than the predetermined allowable value or sets the flag as OFF to not perform the correction of the positional deviation of the component extraction position of the subsequent component in a case that the recognized positional deviation of the component extraction position of the previous component is smaller than the predetermined allowable value.

4. The electronic component mounting apparatus according to claim 1, wherein the holder includes a suction nozzle for sucking the electronic component.

5. The electronic component mounting apparatus according to claim 1, further comprising a lighting unit for illuminating the component extraction position when the imaging camera performs the imaging.

* * * * *